United States Patent [19]

Thomé et al.

[11] Patent Number: 4,912,588
[45] Date of Patent: Mar. 27, 1990

[54] HIGH-TENSION VOLTAGE GENERATOR AND METHOD OF PROTECTING SAME AGAINST ELECTRICAL ARCS

[75] Inventors: Caryl Thomé ; Jean-Pierre Burtin, both of Saint Egreve, France

[73] Assignee: Sames S.A., Meylan, France

[21] Appl. No.: 132,362

[22] Filed: Dec. 14, 1987

[30] Foreign Application Priority Data

Dec. 19, 1986 [FR] France .................... 86 17876

[51] Int. Cl.$^4$ ............................................. H02H 3/16
[52] U.S. Cl. ........................................ 361/45; 361/46; 361/49; 361/85; 361/228
[58] Field of Search ........................ 361/36, 42, 45, 46, 361/49, 85–87, 235, 227, 228, 226, 113

[56] References Cited

U.S. PATENT DOCUMENTS

| | | | |
|---|---|---|---|
| 3,959,695 | 5/1976 | Shimp ........................ | 361/98 |
| 4,133,413 | 1/1979 | Watanabe .................... | 187/29 R |
| 4,159,499 | 6/1979 | Bereskin ...................... | 361/46 X |
| 4,305,108 | 12/1981 | Udren ........................ | 361/96 X |
| 4,672,500 | 6/1987 | Tholome et al. ............... | 361/93 |
| 4,737,887 | 4/1988 | Thome ........................ | 361/228 |

FOREIGN PATENT DOCUMENTS

| | | | |
|---|---|---|---|
| 0135440 | 3/1985 | European Pat. Off. | |
| 3219236 | 1/1983 | Fed. Rep. of Germany. | |
| 2181599 | 4/1987 | United Kingdom ............... | 361/111 |

*Primary Examiner*—Todd E. DeBoer
*Attorney, Agent, or Firm*—Sandler & Greenblum & Bernstein

[57] ABSTRACT

In an electrostatic paint spraying installation or the like, a high-tension voltage generator comprises a voltage rectifier-multiplier in a mobile subsystem and a grounding connection in a fixed subsystem. A conductive wire connects an input terminal of the voltage rectifier-multiplier to the grounding connection. When the high-tension voltage generator operates, a high-frequency alternating current residual signal injected into this conductive wire is sensed and measured. The measured value is compared against a reference value that may be variable. The high-tension voltage generator is disabled if the difference between the measured value and the reference value reaches or crosses a predetermined threshold.

8 Claims, 1 Drawing Sheet

HIGH-TENSION VOLTAGE GENERATOR AND METHOD OF PROTECTING SAME AGAINST ELECTRICAL ARCS

BACKGROUND OF THE INVENTION

1. Field of the Invention

The invention concerns a method of monitoring and providing protection against electrical arcs, implemented in a high-tension voltage generator device and in particular a device of this kind forming part of an installation for electrostatic spraying of a coating product, such as paint or heat-meltable powder. The invention also concerns a high-tension voltage generator device incorporating means for implementing this method.

2. Description of the Prior Art

In an installation of the type mentioned hereinabove, the paint divided into fine droplets is generally charged to a high voltage before leaving the sprayer and is directed towards the object to be painted, which is electrically grounded.

Due to variations in certain parameters, such as the value of the high-tension voltage, the shape of the object and its distance from the sprayer, electrical arcs may be produced which can cause significant damage, especially if the product is flammable.

A high-tension voltage generator device of this kind generally comprises means forming a low-tension direct current voltage supply, a high frequency direct current to alternating current converter fed by the low-tension direct current voltage supply (this is generally an oscillator, a chopping circuit or some other analogous device), a voltage step-up transformer and a voltage rectifier-multiplier of conventional design comprising a cascade circuit of diodes and capacitors. The primary winding of the transformer is fed by the converter and the secondary winding is connected to the low-tension input of the voltage rectifier-multiplier. These various components are divided between a fixed subsystem and a mobile subsystem, the latter forming the paint sprayer that is manipulated by an operator or fixed to a robot arm, for example. The two subsystems are generally interconnected by a harness comprising a plurality of electrical conductors and the paint feed line. The electrical conductors include a so-called "return conductor" connecting one pole of the low-tension input of the voltage rectifier-multiplier to an impedance (generally a high value resistor) that is electrically grounded in the fixed subsystem. This provides a simple way to measure and "monitor" the value of the high-tension current and variations in it which make it possible to predict an imminent electrical arc. The measurement of this current is used, for example, to control a voltage limiter circuit in the low-tension direct current voltage supply. The other conductors include two wires connecting the low-tension supply and the direct current to an alternating current converter if the latter is in the mobile subsystem or two wires connecting the output of the direct current to alternating current converter to the primary winding of the voltage step-up transformer if the converter is in the fixed subsystem. In the former case, the two wires carry a direct current voltage and in the latter case they carry a so-called "high-frequency" (in the order of 20 to 25 kHz) alternating current voltage.

Electrical arcs may also be caused by deterioration of one of these conductors. It has already been proposed to use specific means to monitor the continuity and the insulation of the conductors connecting said fixed and mobile subsystems.

The invention proposes to carry out such monitoring by simple, effective and inexpensive means exploiting the fact that the stray capacitance of the voltage step-up transformer normally injects a high-frequency residual component into the return conductor, so that this residual component can be sensed and measured in the fixed subsystem. It has been observed that, whatever type of defect affects any of the conductors mentioned above, it causes the stray component to disappear or its level to drop significantly. The invention exploits this phenomenon.

SUMMARY OF THE INVENTION

In one aspect, the invention consists in a method of monitoring and protecting against electrical arcs in a high-tension voltage generator comprising a mobile subsystem, a voltage rectifier-multiplier in said mobile subsystem, an input terminal of said voltage rectifier-multiplier, a fixed subsystem, a grounding connection in said fixed subsystem and a conductive wire connecting said input terminal to said grounding connection, in which method a high-frequency alternating current residual signal injected into said conductive wire is sensed and measured, the measured value is compared with an optionally variable reference value and said high-tension voltage generator is disabled if the difference between said measured value and said reference value reaches a predetermined threshold.

In another aspect, the present invention consists in a high-tension voltage generator device comprising a fixed subsystem and a mobile subsystem and, in said fixed subsystem or in said mobile subsystem, a low-tension direct current voltage supply, a high-frequency direct current to alternating current converter connected to said low-tension direct current voltage supply, a voltage step-up transformer having a primary winding connected to an output of said converter and a voltage rectifier-multiplier having a low-tension input connected to a secondary winding of said transformer, said device further comprising a plurality of conductors interconnecting said fixed subsystem and said mobile subsystem and including a return conductor, at least one impedance in said fixed subsystem through which said low-tension input is adapted to be grounded by said return conductor, and, in said fixed subsystem, high-frequency residual component measuring means coupled to said return conductor, a comparator having two inputs, a reference voltage source and disabling means adapted to interrupt the flow of current to said mobile subsystem, said measuring means and said reference voltage source having respective outputs connected to said two inputs of said comparator and said comparator having an output connected to said disabling means.

The invention will be better understood and other advantages of the invention will emerge more clearly from the following description given by way of example only and with reference to the appended diagrammatic drawing.

BRIEF DESCRIPTION OF THE DRAWING

The appended drawing is a circuit diagram of a high-tension voltage generator device in which the invention is implemented.

DESCRIPTION OF THE PREFERRED EMBODIMENT

Figure 1:
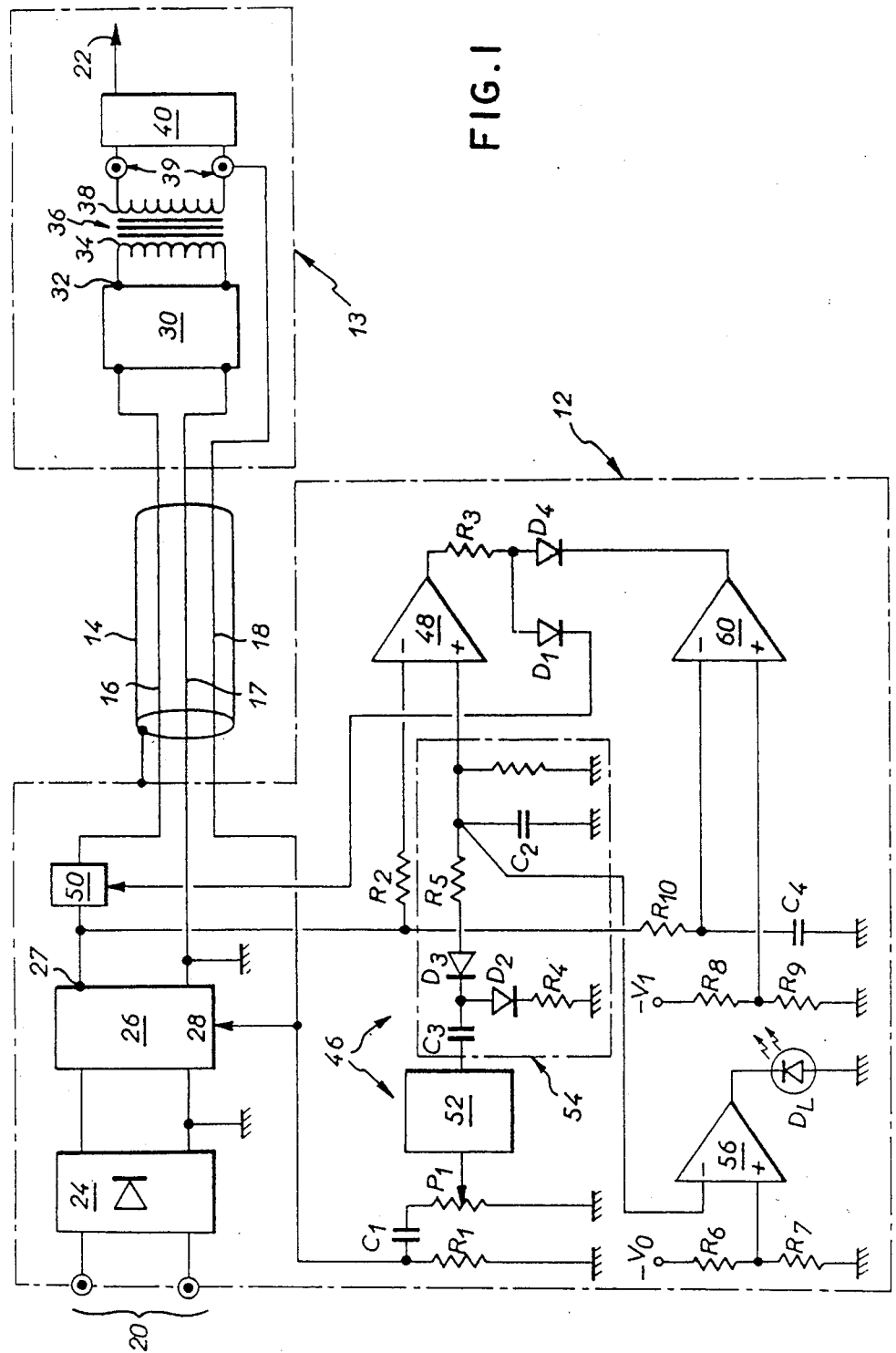

The diagram shows by way of example part of an installation for the electrostatic spraying of a coating product, such as paint, specifically the high-tension voltage generator device which is split between a fixed subsystem 12 and a mobile subsystem 13 near or combined with the paint sprayer. A harness 14 comprises paint and compressed air feed lines (not shown) and several electrical conductors 16, 17 and 18. The latter conductor is referred to hereinafter as the "return conductor" for convenience and for reasons that will emerge later.

The device comprises various components divided between the two subsystems and connected overall between the terminals 20 of the alternating current mains and an ionization electrode 22. The elements contained in the fixed subsystem are: a rectifier 24 feeding a voltage regulator or limiter circuit 26 of conventional design delivering at its output 27 a low-tension direct current voltage variable as a function of the value of a control voltage applied to a control input 28. The combination of the rectifier 24 and the regulator or limiter circuit 26 thus constitutes a low-tension direct current voltage supply. This direct current voltage is applied by the two conductors 16, 17 in the harness 14 to the supply terminals of a high-frequency direct current to alternating current converter 30 situated in the mobile subsystem 13. In this instance the converter is an oscillator running at a frequency of between 20 and 25 kHz, for example. Consequently, the amplitude of the oscillations at the output 32 of the oscillator depends on the value of the low-tension supply voltage to the oscillator, that is to say on the voltage produced by the regulator or limiter circuit 26. The output 32 of the oscillator is connected to the primary winding 34 of a voltage step-up transformer 36, the secondary winding 38 of which is connected to the low-tension input 39 of a voltage rectifier-multiplier 40. This comprises, in the conventional way, a cascade circuit of diodes and capacitors and its output is connected to the electrode 22. In the known way, one pole of the low-tension supply 39 (that is connected to the "bottom" of the secondary winding 28) is connected to said "return conductor" which is connected at its other end to an impedance in the subsystem 12, in this instance essentially a resistor $R_1$ that is electrically grounded. Consequently, the direct current voltage available across this resistor is representative of the high-tension current. This voltage is therefore applied to the input 28 of the circuit 26 so as to vary the supply voltage of the oscillator 30 (and thus the high-tension voltage) so as to limit the high-tension voltage at least or even to cause the device to trip out if the high-tension current and/or its variation increases, which indicates the risk of electrical arcing. All of this arrangement is known in itself and therefore does not require to be described in more detail. The distribution of the components described hereinabove between the fixed subsystem and the mobile subsystem may be different to that shown. In particular, the oscillator may be in the fixed subsystem, in which case the conductors 16 and 17 would apply a high-frequency alternating current low-tension voltage to the primary winding of the voltage step-up transformer in the mobile subsystem.

The stray capacitance of the voltage step-up transformer 36 is never negligible in practice, with the result that a high-frequency alternating current residual component is injected into the return conductor. This residual component is therefore available and usable across the resistor $R_1$.

It has been found that the presence of this residual component is a sure indication of the continuity and the insulation (and thus of the condition) of the conductors in the harness 14. If any of these conductors should be broken or should its insulation deteriorate, the high-frequency residual component disappears or is significantly attenuated. The invention exploits this phenomenon by sensing and measuring the high-frequency alternating current residual component injected into the return conductor, comparing the measured value with a reference value, which is variable in this case, and disabling the high-tension voltage generator means if the difference between the measured value and the reference value reaches or crosses a predetermined threshold. In this example, the reference value is representative of the output voltage of the circuit 26.

Means 46 for measuring the high-frequency residual component are provided in the fixed subsystem 12 and coupled to the return conductor 18 (that is to say across the resistor $R_1$) while a comparator 48 such as an operational amplifier with two differential inputs has one input connected to the output of the measuring means 46 and the other input connected via a resistor $R_2$ or any other appropriate network to the output 27 of the circuit 26. The output of the comparator 48 is connected via a resistor $R_3$ and a diode $D_1$ in series to tripping or disabling means 50 adapted to interrupt the flow of electrical current to the mobile subsystem 13. Here, for example, it is a circuit-breaker 50 connected in series into the link between the circuit 26 and the converter 30.

To be more precise, the measuring means 46 comprise in succession means for sampling the residual component (namely a simple capacitor $C_1$ connected to the point common to the resistor $R_1$ and to the return conductor 18), level matching means in the form of a potentiometer $P_1$, an impedance matching circuit 52 and rectifier and filter means 54 the output voltage from which, across a capacitor $C_2$, is representative of the average value of the high-frequency residual component. The output of the rectifier and filter means 54 is also that of the measuring means 46. It is therefore connected to one input of the comparator 46. The potentiometer $P_1$ is simply connected between one side of the capacitor $C_1$ and ground and its cursor is connected to the impedance matching circuit 52. This latter circuit is not shown in detail; it may be of a known type comprising a common emitter transistor stage, for example. The rectifier and filter means 54 comprise a coupling capacitor $C_3$ connected between the output of the circuit 52 and the point common to the two recifier diodes, one of which (diode $D_2$) is grounded via a resistor $R_4$ and the other of which (diode $D_3$) is connected to the capacitor $C_2$ by a resistor $R_5$. The output of the rectifier and filter means 54 is connected to one input of a differential amplifier 56 around which an adjustment control circuit is constructed. The other input of the amplifier 56 is biased by a resistor bridge comprising two resistors $R_6$, $R_7$ connected in series between a reference potential $-V_0$ and ground. The output of the amplifier 56 feeds a light-emitting diode $D_L$.

The circuit is completed by a circuit for disabling the comparator means 48 which is active only during switching on to prevent the circuit-breaker 50 tripping out. This circuit comprises a comparator 60 in the form of another differential amplifier, the output of which is connected by a diode $D_4$ to the point common to the resistor $R_3$ and to the diode $D_1$. The two diodes $D_1$ and $D_4$ have their cathodes connected together. the non-inverting input of the differential amplifier is biased by connecting it to the point common to two resistors $R_8$, $R_9$ connected in series between a reference potential $-V_1$ and ground. The inverting input of the differential amplifier is connected by a resistor $R_{10}$ to the output 27 of the circuit 26. A capacitor $C_4$ is connected between the inverting input and ground.

Operation is extremely simple and obvious from the foregoing description. Use is preceded by an adjustment phase adapted to allow for the length of the harness 14 and thus for that of the return conductor 18. At the frequency in question this conductor has a non-negligible impedance which results in some attenuation of the injected residual component. For this reason the potentiometer $P_1$ is adjusted until the voltage across capacitor $C_2$ is just sufficient to turn on the diode $D_L$. From then onwards the direct current voltage across the capacitor $C_2$, which is representative of the average value of the stray component sampled by the capacitor $C_1$, is compared with another direct current voltage representative of the value of the low-tension voltage supplying the oscillator 30. Given the conditions stated hereinabove, this voltage may be variable. If the voltage across capacitor $C_2$ falls below the reference value applied to the other input of the comparator 48, the latter changes state and actuates the circuit-breaker 50.

In the case mentioned hereinabove where the converter 30 is in the fixed subsystem 12, the inverting input of the comparator 48 may be connected to the output of the converter through appropriate rectifier means. Operation is then comparable with that as just described.

We claim:

1. A high-tension voltage generator device, comprising:
    a first subsystem, comprising:
        a low-tension direct current voltage supply;
        means for measuring a low level, high-frequency residual component;
        a comparator having two inputs and one output, said high-frequency residual component measuring means being connected to one of said inputs;
        a reference voltage that is connected to the remaining input of said comparator; and
    means for disabling the flow of current from said low-tension direct current voltage supply, said output of said comparator being connected to said disabling means;
    a second subsystem, consisting:
        a high-frequency direct current to alternating current converter connected to said low-tension direct current voltage supply;
        a voltage step-up transformer having a primary winding connected to an output of said converter; and
        a voltage rectifier-multiplier having a low-tension input connected to a secondary winding of said transformer; and
    means for interconnecting said first subsystem to said second subsystem, said interconnecting means including a DC current return line connected to said low-tension input for picking up and supplying said residual component to said measuring means and at least one impedance in said first subsystem through which said low-tension input is adapted to be grounded by said DC current return line, said high-frequency residual signal being superimposed upon a variable DC current, said high-frequency residual measuring means being located in said first subsystem and being coupled to said DC current return line.

2. The device of claim 1, wherein said high-frequency residual component measuring means comprises:
    means for sampling said residual component;
    means for adjusting the level of said high-frequency residual component for varying lengths of said DC current return line; and,
    means for rectifying and filtering said high-frequency residual component to produce a direct current output voltage that is representative of said high-frequency residual component, said output voltage being inputted to one input of said comparator.

3. The device of claim 2, further comprising an adjustment control circuit that has an input that is connected to an output of said rectifying and filtering means.

4. The device of claim 1, wherein said reference voltage connected to said comparator is obtained from said low-tension direct current voltage supply.

5. The device of claim 1, wherein said disabling means operates to disable the flow of current to said second subsystem when the difference between said reference voltage and said high-frequency residual component reaches a predetermined value.

6. A high-tension voltage generator device, comprising:
    a low-tension direct current voltage supply;
    means for measuring a low level, high-frequency residual component;
    a comparator having two inputs and one output, said high-frequency residual component measuring means being connected to one of said inputs;
    a reference voltage that is connected to the remaining input of said comparator;
    means for disabling the flow of current from said low-tension direct current voltage supply, said output of said comparator being connected to said disabling means;
    a high-frequency direct current to alternating current converter connected to said low-tension direct current voltage supply;
    a voltage step-up transformer having a primary winding connected to an output of said converter;
    a voltage rectifier-multiplier having a low-tension input connected to a secondary winding of said transformer; and
    means for interconnecting said low-tension direct current voltage supply to said direct current to alternating current converter, said interconnecting means including a DC current return line connected to said low-tension input for picking up and supplying said residual component to said measuring means and at least one impedance through which said low-tension input is adapted to be grounded by said DC current return line, said high-frequency residual signal being superimposed upon a variable DC current, said high-frequency residual measuring means being coupled to said DC current return line.

7. A method of monitoring and protecting against electrical arcs in a high-tension voltage generator, comprising:

generating a high-tension voltage, the high-tension generator having a low-tension direct current signal source for producing a direct current signal, the direct current signal being supplied to a high frequency alternating current converter which supplies an alternating current to a voltage rectifier-multiplier;

detecting a low level, high-frequency alternating current residual signal that is superimposed upon a direct current signal from an input terminal of the voltage rectifier-multiplier;

converting the alternating current residual signal to a voltage signal;

inputting the voltage signal to an input terminal of the comparator;

inputting a reference voltage to a remaining input terminal of the comparator, the reference voltage being obtained from the output of the low-tension direct current signal source; and controlling a disabling means in response to an output signal from the comparator, the disabling means operating to electrically disconnect the direct current signal source from the convertor when the high-frequency alternating current residual signal exceeds a predetermined value.

8. The method of claim 7, wherein the reference voltage is representative of an alternating current power delivered by the converter supplying the necessary electrical energy to the voltage rectifier-multiplier.

* * * * *